(12) United States Patent
Zhou et al.

(10) Patent No.: US 11,101,746 B2
(45) Date of Patent: Aug. 24, 2021

(54) BIPOLAR STAGGERED COMB DRIVE FOR BIDIRECTIONAL MEMS ACTUATION

(71) Applicant: DiDi Research America, LLC, Mountain View, CA (US)

(72) Inventors: Qin Zhou, Mountain View, CA (US); Youmin Wang, Berkeley, CA (US); Yue Lu, Los Gatos, CA (US); Lingkai Kong, Palo Alto, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 291 days.

(21) Appl. No.: 16/219,855

(22) Filed: Dec. 13, 2018

(65) Prior Publication Data

US 2020/0195169 A1    Jun. 18, 2020

(51) Int. Cl.
*H02N 1/00*    (2006.01)
*H02P 25/00*    (2006.01)
(Continued)

(52) U.S. Cl.
CPC .......... *H02N 1/008* (2013.01); *B81B 3/0021* (2013.01); *B81B 3/0043* (2013.01); *B81B 7/008* (2013.01);
(Continued)

(58) Field of Classification Search
CPC .......... H02N 1/008; H02N 1/08; H02P 25/00; B81B 3/0021; B81B 2201/033; B81B 7/008; B81B 3/0043
(Continued)

(56) References Cited

U.S. PATENT DOCUMENTS 8,339,014 B2 * 12/2012 Kandori ................ B81B 3/0086
310/309
2001/0034938 A1    11/2001 Behin et al.
(Continued)

FOREIGN PATENT DOCUMENTS

CN    102955046 A    3/2013
DE    102008003344 A1    7/2009
JP    2006154315 A    6/2006

OTHER PUBLICATIONS

International Search Report issued in corresponding International Application No. PCT/US2018/067570, dated Apr. 23, 2019, 4 pages.
(Continued)

*Primary Examiner* — John K Kim
(74) *Attorney, Agent, or Firm* — Bayes PLLC (57) ABSTRACT

Embodiments of the disclosure provide a comb drive, a comb drive system, and a method of operating the comb drive to rotate bi-directionally in a MEMS environment. An exemplary comb drive system may include a comb drive, at least one power source, and a controller. The comb drive may include a stator comb having a first electrically conductive layer spaced apart from a second electrically conductive layer. The comb drive may also include a rotor comb having a first electrically conductive layer spaced apart from a second electrically conductive layer. The controller may be configured to apply first and second voltage levels having opposite polarities to the first and second electrically conductive layers of the rotor comb, respectively. The controller may also be configured to apply an intermediate voltage level to one of the first or second electrically conductive layers of the stator comb.

14 Claims, 8 Drawing Sheets

(51) Int. Cl.
  *B81B 3/00*    (2006.01)
  *B81B 7/00*    (2006.01)
  *H02N 1/08*    (2006.01)

(52) U.S. Cl.
  CPC ........ *H02P 25/00* (2013.01); *B81B 2201/033* (2013.01); *H02N 1/08* (2013.01)

(58) Field of Classification Search
  USPC .................................................. 310/300, 309
  See application file for complete search history.

(56) References Cited

U.S. PATENT DOCUMENTS

| | | | | |
|---|---|---|---|---|
| 2004/0119376 A1* | 6/2004 | Chou | ................... | G02B 6/3584 |
| | | | | 310/309 |
| 2004/0263937 A1* | 12/2004 | Fujii | .................. | G02B 26/0841 |
| | | | | 359/199.1 |
| 2010/0213791 A1* | 8/2010 | Kandori | ............. | G01C 19/5719 |
| | | | | 310/309 |
| 2011/0109194 A1* | 5/2011 | Hung | ..................... | H02N 1/008 |
| | | | | 310/300 |
| 2016/0204716 A1* | 7/2016 | Suzuki | .................. | B81B 3/0054 |
| | | | | 359/230 |
| 2020/0195169 A1* | 6/2020 | Zhou | ........................ | B81B 7/008 |

OTHER PUBLICATIONS

Written Opinion of the International Searching Authority issued in corresponding International Application No. PCT/US2018/067570, dated Apr. 23, 2019, 5 pages.

* cited by examiner

BIPOLAR STAGGERED COMB DRIVE FOR BIDIRECTIONAL MEMS ACTUATION

TECHNICAL FIELD

The present disclosure relates to a comb drive, a comb drive system, and a method of operating a comb drive, and more particularly, to a system and method for driving a MEMS device in opposing directions utilizing a bipolar staggered comb drive.

BACKGROUND

Comb drives are widely used in microelectromechanical systems (MEMS) to provide actuation forces. For example, a comb drive can be used to tilt or finely tune the angle of a micromachined mirror in scanning, imaging, and display applications. One type of comb drive is known as a Staggered Vertical Comb Drive (SVC).

An SVC includes a stationary or stator comb, and a rotational or rotor comb to which the mirror (or other MEMS device) is typically connected. Each comb has a plurality of fingers spaced apart from each other that extend in parallel away from a spine. The spines of the stator and rotor combs are placed opposite each other and staggered, such that the fingers of each comb are pointed toward the spine of the other comb and interdigitated with the fingers of the other comb. The stator comb lies in a stator plane, while the rotor comb lies in a parallel plane offset from the stator plane when the SVC is in a deactivated or neutral state. The spine of the rotor comb is pivotally constrained to the stator plane by way of a torque hinge.

During operation, the rotor comb is grounded, while the stator comb is selectively charged. When the stator comb is not charged (e.g., grounded), the torque hinge exerts a force sufficient to pivot the fingers of the rotor comb into the offset plane. When the stator comb is charged, an electrostatic force is generated between the charged fingers of the stator comb and the grounded fingers of the rotor comb, pulling the fingers of the rotor comb against the bias of the torque hinge and into the stator plane. The angle through which the rotor comb pivots during actuation is a function of the applied voltage and geometries of the rotor and stator combs. Upon removal of the voltage, the torque hinge returns the rotor comb from the activated position to the neutral position.

While traditional SVCs may be adequate for some situations, their application and benefit may be limited. In particular, because a traditional SVC is driven only in a single direction (e.g., away from the rotor plane and into the stator plane), the range of motion of the traditional SVC is small.

To increase the range of motion in a MEMS using traditional SVCs, the rotor comb can be modified to have two sets of fingers protruding opposite each other from a single spine. Each set of rotor fingers are then interdigitated with fingers from separate stator combs. Alternatively, a second rotor/stator pairing can be overlapped and bonded with the first rotor/stator pairing; the two rotor combs are driven in opposite directions at different times. Both of these arrangements may allow for movement from the neutral rotor plane in opposing directions (e.g., clockwise and counterclockwise directions) by the same amount, thereby effectively doubling the range of motion of a typical SVC. However, the cost and complexity of such arrangements may be prohibitive in some applications.

Embodiments of the disclosure address the above problems via a unique comb drive, a unique comb drive system, and a unique method of comb drive operation.

SUMMARY

In one aspect, embodiments of the disclosure provide a comb drive system. The comb drive system may include a comb drive. The comb drive may include a stator comb having a first electrically conductive layer spaced apart from a second electrically conductive layer. The comb drive may also include a rotor comb having a first electrically conductive layer spaced apart from a second electrically conductive layer. The comb drive system may also include at least one power source. The comb drive system may further include a controller connected between the at least one power source and the comb drive. The controller may be configured to apply a first voltage level from the at least one power source to the first electrically conductive layer of the rotor comb. The controller may also be configured to apply a second voltage level from the at least one power source to the second electrically conductive layer of the rotor comb. The first and second voltage levels may have opposite polarities. Moreover, the controller may be configured to apply an intermediate voltage level to one of the first and second electrically conductive layers of the stator comb. The intermediate voltage level may be within a range defined by the first and second voltage levels.

In another aspect, embodiments of the disclosure also provide a method of operating a comb drive having a stator comb and a rotor comb. The method may include applying a first voltage level from at least one power source to a first electrically conductive layer of the rotor comb. The method may also include applying a second voltage level from the at least one power source to a second electrically conductive layer of the rotor comb. The first and second voltage levels may have opposite polarities. Moreover, the method may include applying an intermediate voltage level to one of the first and second electrically conductive layers of the stator comb. The intermediate voltage level may be within a range defined by the first and second voltage levels.

In a further aspect, embodiments of the disclosure provide a comb drive. The comb drive may include a stator comb having a first electrically conductive layer spaced apart from a second electrically conductive layer. The comb drive may also include a rotor comb having a first electrically conductive layer spaced apart from a second electrically conductive layer. Teeth of the rotor comb may be interdigitated with teeth of the stator comb.

It is to be understood that both the foregoing general description and the following detailed description are exemplary and explanatory only and are not restrictive of the invention, as claimed.

DETAILED DESCRIPTION

Reference will now be made in detail to the example embodiments, examples of which are illustrated in the accompanying drawings. Wherever possible, the same reference numbers will be used throughout the drawings to refer to the same or like parts.

Figure 1A:
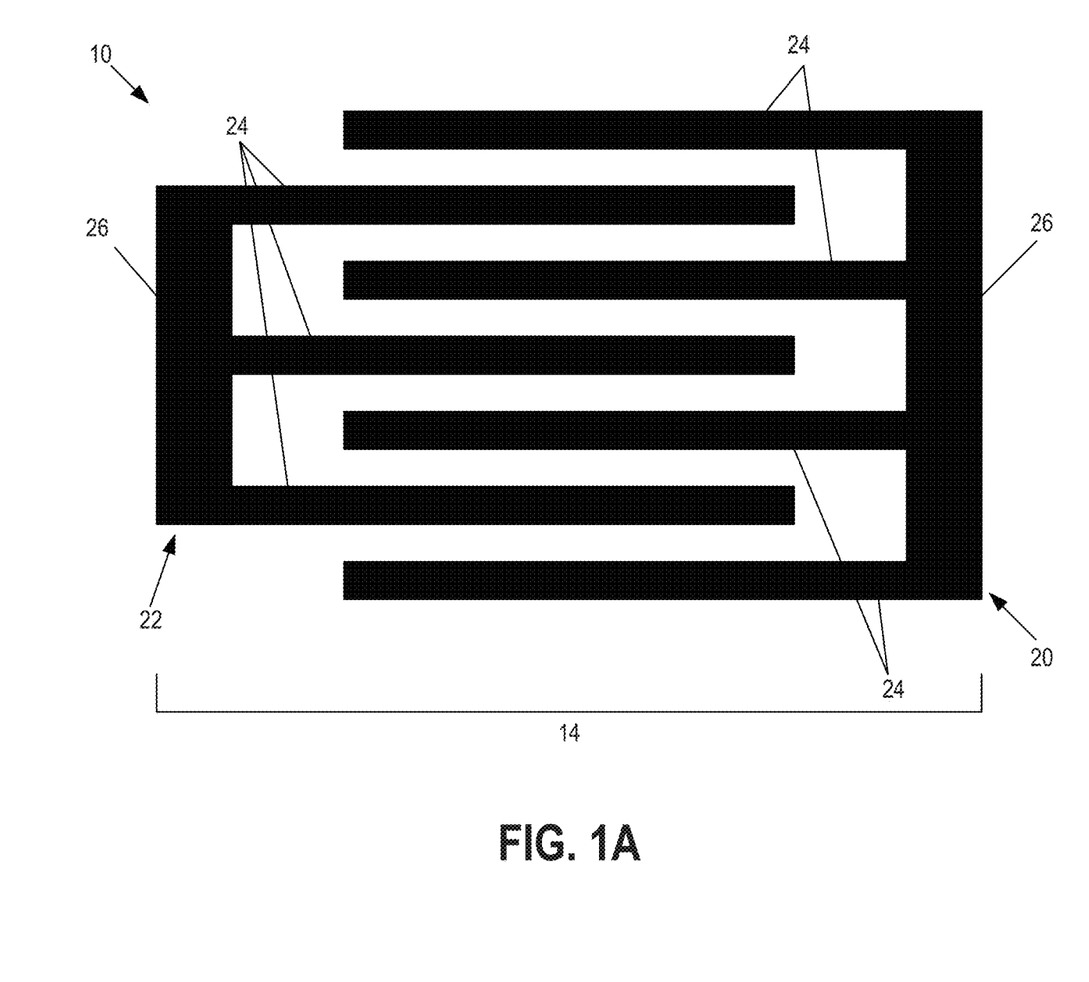
FIGS. 1A-1D illustrate two-dimensional schematic diagrams of an example comb drive and system, according to embodiments of the disclosure.
Figure 1B:
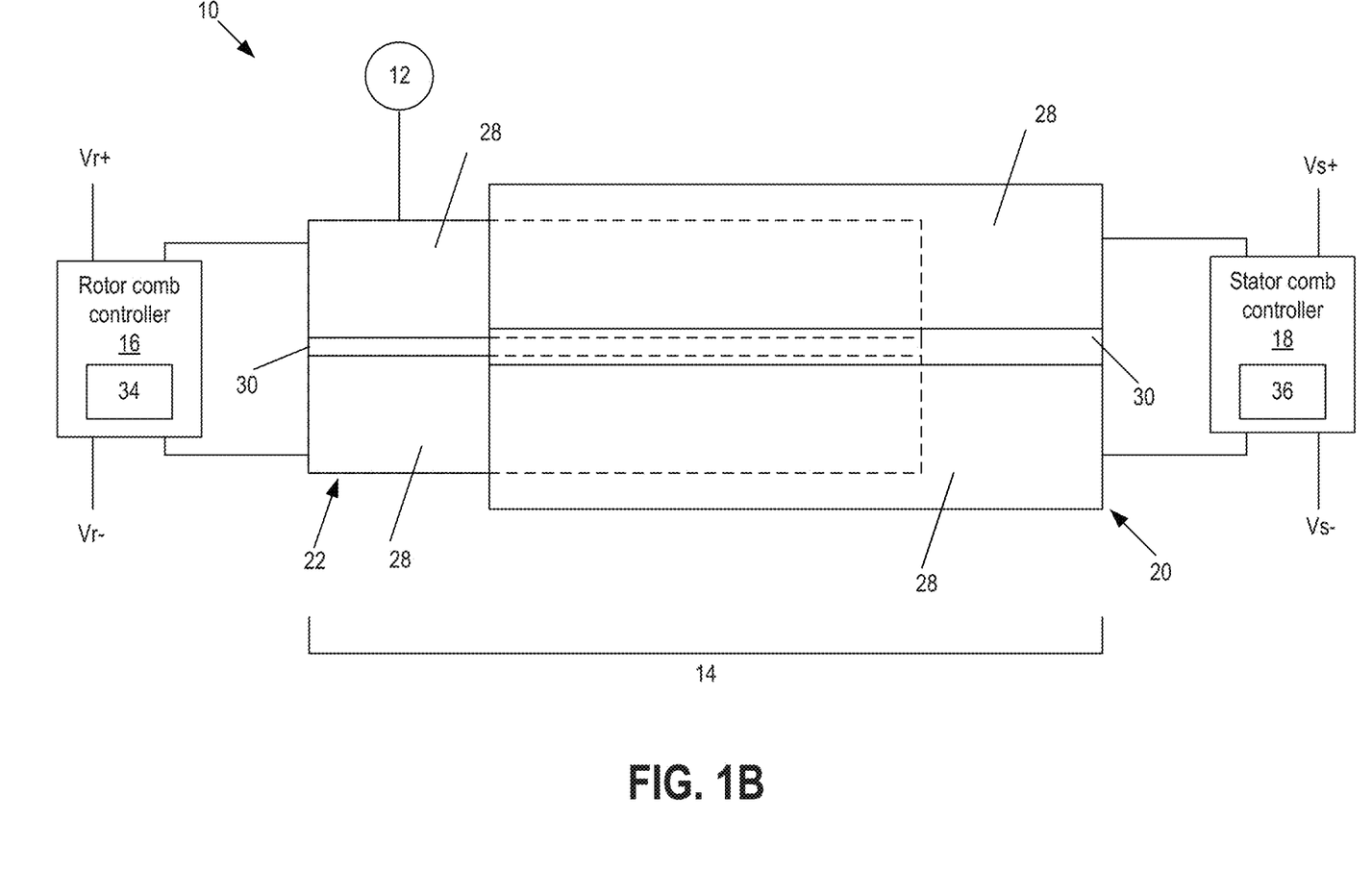
Figure 1C:
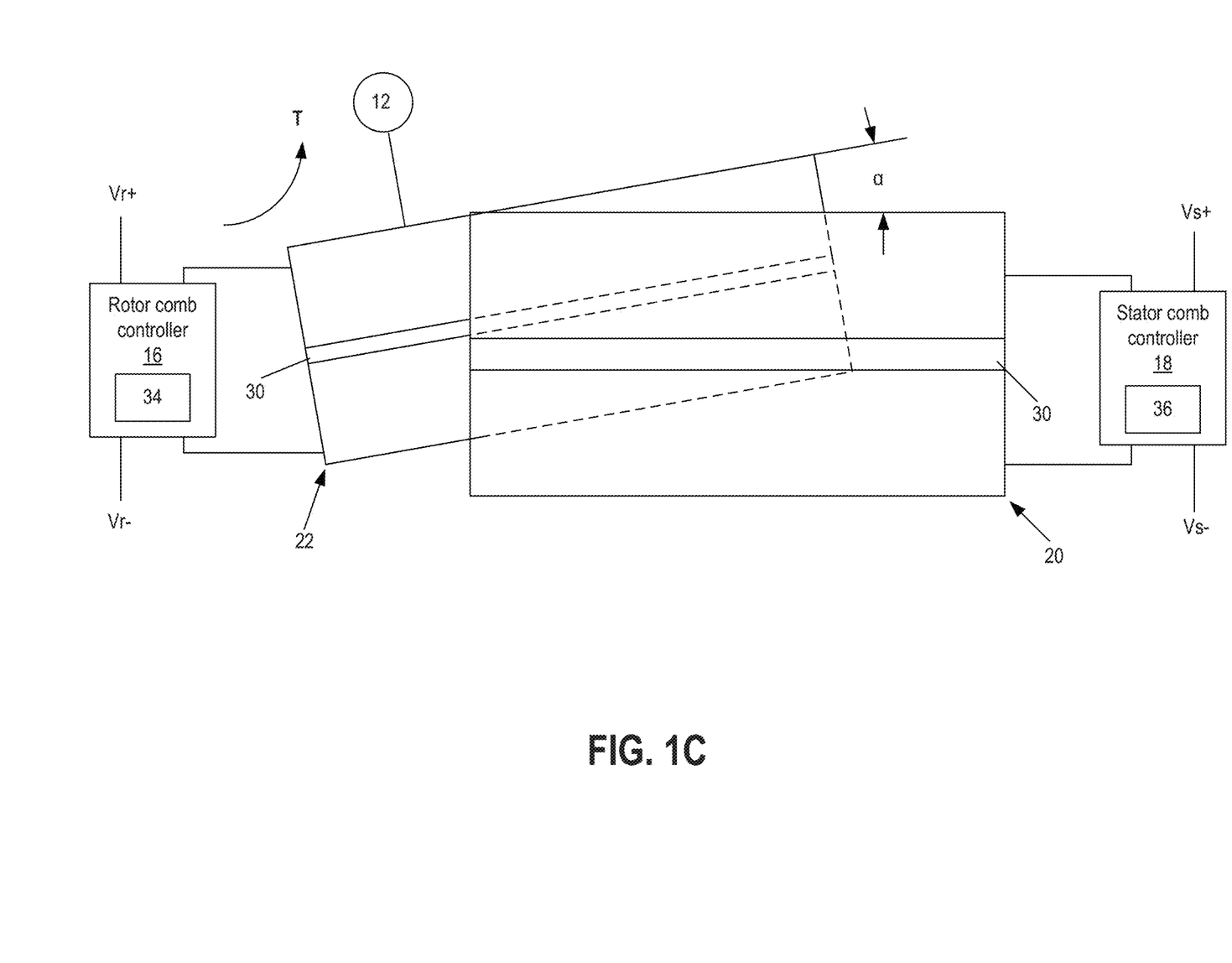
Figure 1D:
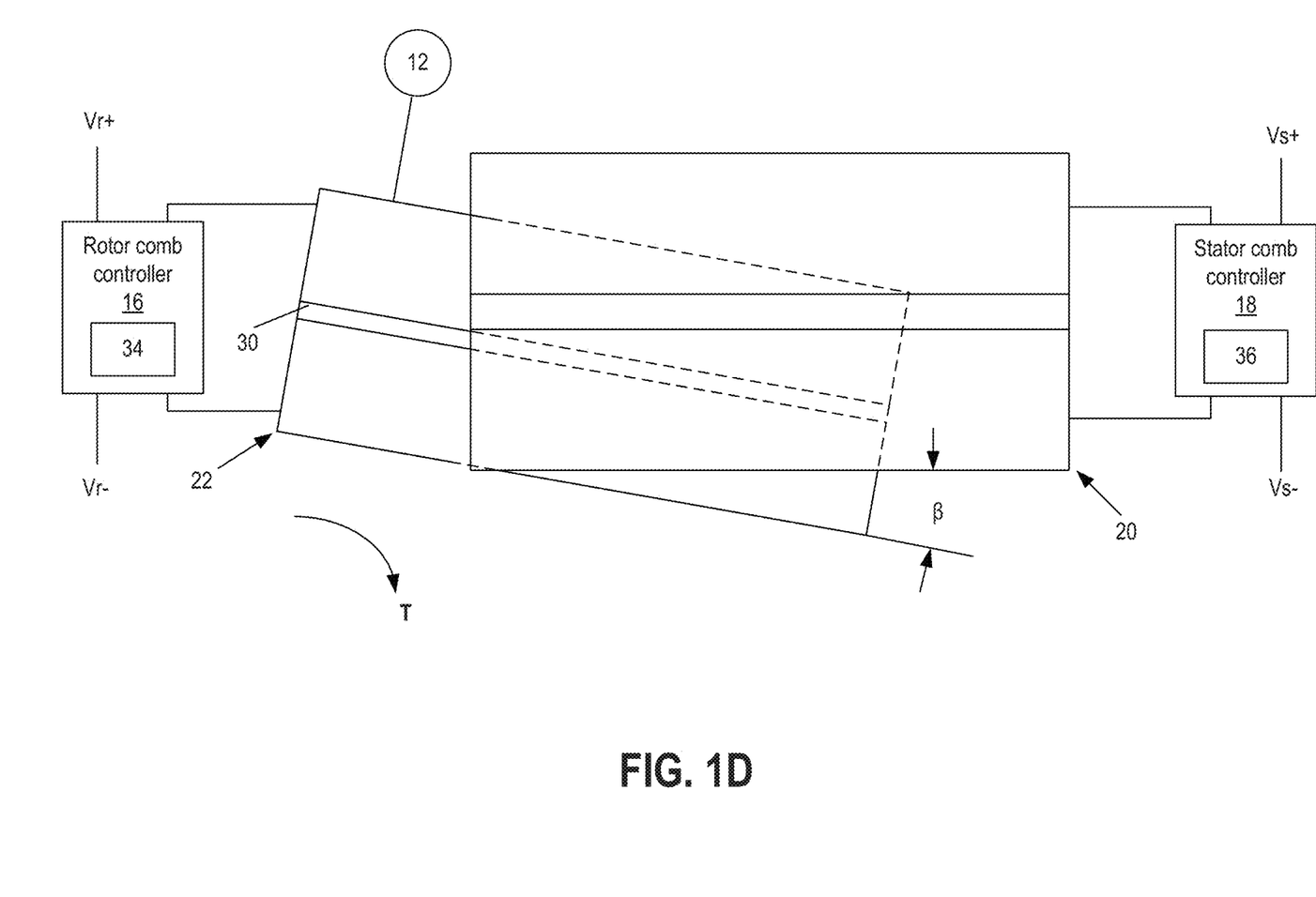
Figure 2A:
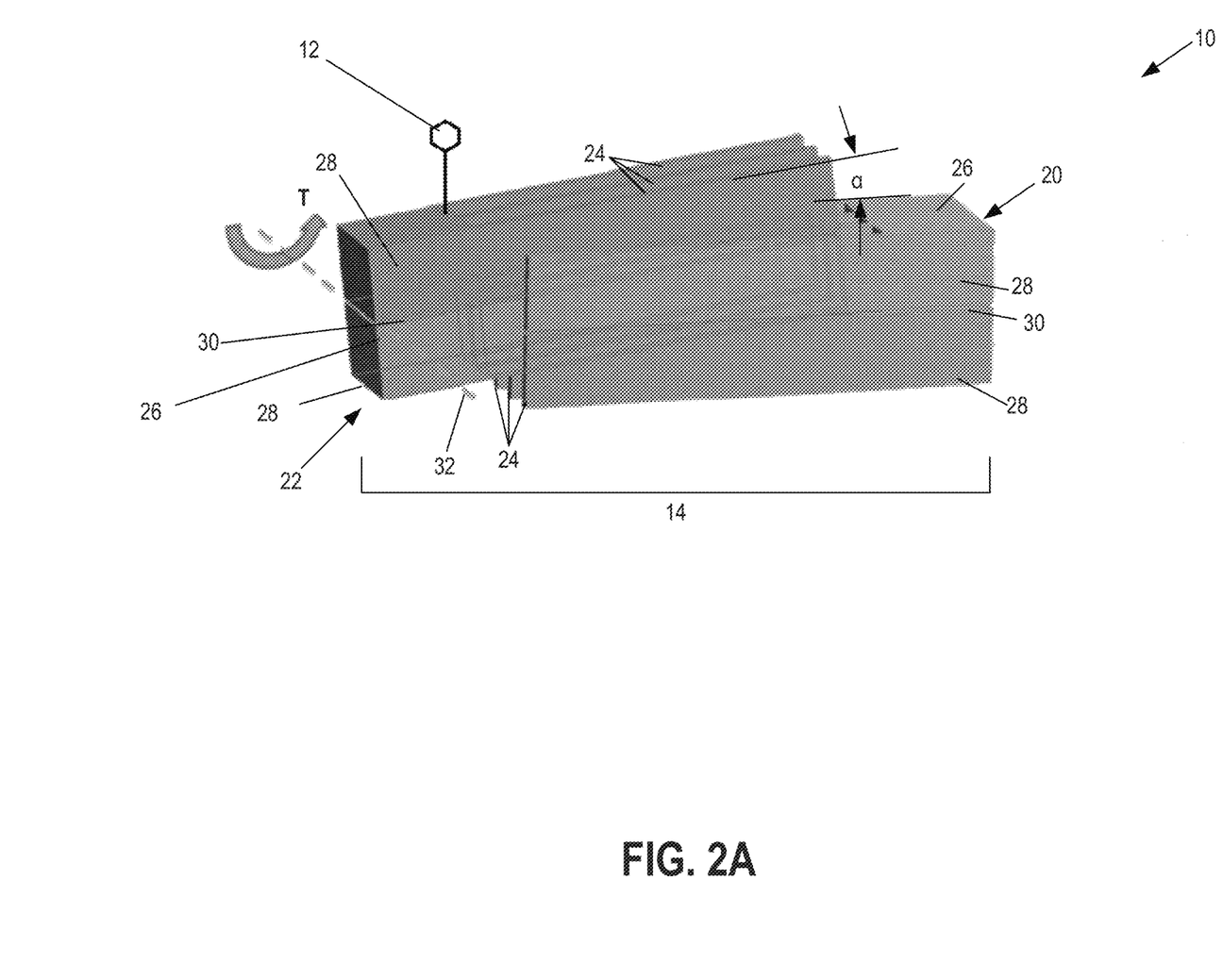
FIGS. 2A-2B illustrate three-dimensional schematic diagrams of the example comb drive and system shown in FIGS. 1A-1D, according to embodiments of the disclosure.
Figure 2B:
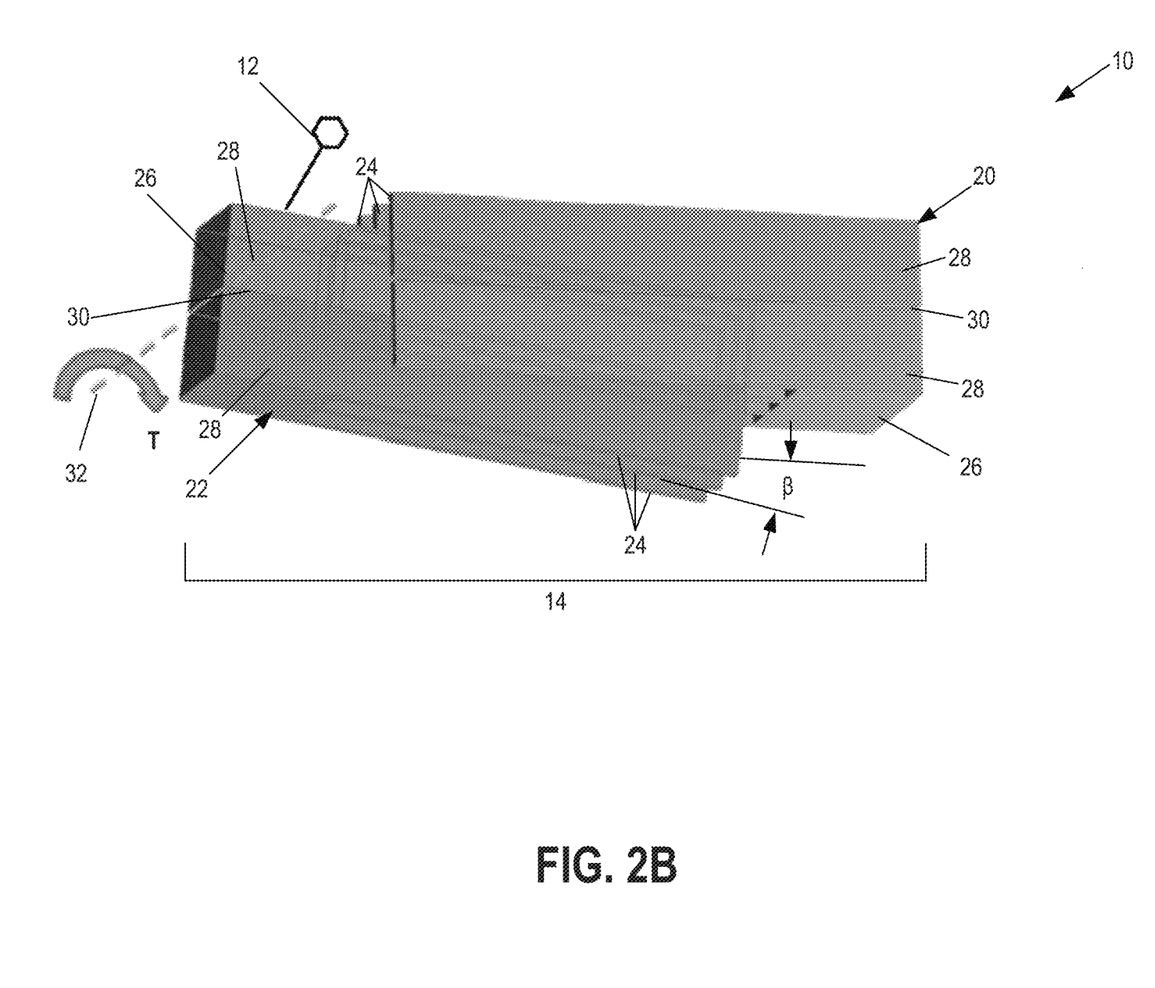

FIGS. 1A-1D and 2A-2B illustrate an exemplary comb drive system 10 for generating a rotational actuation torque T. FIG. 1A is a two-dimensional (2D) top view of system 10. FIGS. 1B-1D are side views of system 10. FIGS. 2A-2B are three-dimensional views of system 10. It is noted that the schematic drawings shown in FIGS. 1A-1D and 2A-2B are exemplary only. The schematic drawings are not necessarily to scale and may not include complete details. For example, while FIG. 1A shows a rotor comb 22 having three fingers (24) and a stator comb 20 having four fingers (24), rotor comb 22 and stator comb 20 may include any number of fingers. In another example, while in FIGS. 1B-1D, rotor comb 22 appears smaller than stator comb 20 for the purpose of illustrating that they overlap with each other, rotor comb 22 and stator comb 20 may have substantially the same size or may have a size relationship different from what is depicted in FIGS. 1B-1D.

In the disclosed embodiment, the rotational actuation torque T is used to tilt a mirror and/or another optic 12 within a MEMS environment. It is contemplated, however, that the rotational actuation torque T could be used for other purposes within the MEMS environment and/or within other applications. The rotational actuation torque T may be sufficient to tilt optic 12 from a neutral position (shown in FIG. 1B) to a first end position (shown in FIG. 1C) and/or from the neutral position to a second end position (shown in FIG. 1D). Optic 12 may be tilted to and held at any position between the first and second end positions. The first end position may be associated with a first angle α on one side of the neutral position, while the second end position may be associated with a second angle β on an opposite side of the neutral position. In some embodiments, angle α is equal to angle β. In other embodiments, however, angle α may be different from angle β.

As shown in FIG. 1B, System 10 may include, among other things, a comb drive 14 to which optic 12 is connected, one or more power sources such as voltage sources Vr+, Vr−, Vs+, and Vs− for applying voltage to components of comb drive 14, a rotor comb controller 16, and a stator comb controller 18. In some embodiments, voltage sources Vr+, Vr−, Vs+, and Vs− may be implemented by multiple power sources or by a single power source. For example, these voltage sources may be implemented separately by individual power sources providing the needed voltage levels. In another example, one or more of the voltage sources may be implemented by a single power source having multiple outputs, or by manipulating a single output (e.g., by splitting, scaling, inverting, etc.) to produce the needed voltage levels. In some embodiments, one or more of Vr+, Vr−, Vs+, and Vs− may share a power source. For example, when Vr+ is equal to Vs+, both Vr+ and Vs+ can be provided by a single power source. In some embodiments, one or more of Vr+, Vr−, Vs+, and Vs− may be grounded. In this case, it is not necessary to produce the grounded voltage level using a power source.

Comb drive 14 may be an assembly of components that cooperate to generate the rotational actuation torque T applied to optic 12, when comb drive 14 is activated (e.g., by controller 16/18). These components may include, among other things, a stator comb 20, and a rotor comb 22 to which optic 12 may be operably connected. Each of stator and rotor combs 20, 22 may include a plurality of fingers 24 (as shown in FIG. 1A) that are transversely spaced apart from each other (e.g., relative to a longitudinal direction of fingers 24) and that extend in parallel away from an associated spine 26. Spines 26 of stator and rotor combs 20, 22 may be oriented opposite each other and staggered transversely, such that the fingers 24 of each comb 20, 22 are pointed inward toward the spine 26 of the other comb 20, 22 and interdigitated with the fingers 24 of the other comb 20, 22.

Fingers 24 and spine 26 of stator comb 20 may be formed from multiple overlapping layers of material that have similar geometry. The overlapping layers of material may include electrically conductive layers 28 (shown in FIG. 1B) that are spaced apart from each other in a normal direction by way of one or more insulating intermediate layers 30.

In the disclosed embodiment, electrically conductive layers 28 of stator comb 20 are substantially identical (e.g., within engineering tolerances) to each other and fabricated from any material suitable for conducting an electric current. For example, electrically conductive layers 28 of stator comb 20 may be fabricated to have a same shape and thickness from a silicon material (e.g., from single-crystalline silicon or polycrystalline silicon), copper, gold, silver, etc. It is contemplated, however, that a shape, thickness, and/or material of electrically conductive layers 28 could be different.

Insulating layer(s) 30 of stator comb 20 may have a shape that is substantially identical (e.g., within engineering tolerances) to a shape of adjacent electrically conductive layers 28, but with a reduced thickness in some applications. Insulating layer(s) 30 of stator comb 20 may be made from any suitable material that is electrically insulating. For example, insulating layer(s) 30 of stator comb 20 may be made from a silicon material (e.g., from silicon oxide). Alternatively, insulating layer(s) 30 of stator comb 20 may simply constitute an orthogonal spacing between conductive layers 28 that is sufficient to inhibit arcing between adjacent conductive layers 28. The spacing may be filled with air or another inert gas (e.g., argon, helium, etc.).

In some embodiments, the finger and spine geometries of each layer 28, 30 of stator comb 20 are fabricated separately, stacked on top of each other, and thereafter bonded together to form fingers 24 and spine 26. In other embodiments, however, the finger and spine geometries are formed within all layers 28, 30 of stator comb 20 at about the same time. For example, the finger and spine geometries of all layers 28, 30 may be made from a pre-fabricated double-silicone-on-insulator (DSOI) wafer.

Stator comb 20 may be stationary within system 10. For example, stator comb 20 may be fixedly connected to (e.g., integral with) a substrate (not shown) that forms a common base for any number of different comb drives within system 10. It is contemplated that only one or both fingers 24 and spine 26 of stator comb 20 may be fixedly connected to the substrate. It is also contemplated that other components (e.g., power sources and/or controller 16/18) of system 10 may be fixedly connected to (e.g., mounted on) the same substrate.

Fingers 24 and spine 26 of rotor comb 22 may also be formed from multiple overlapping layers of material that have similar geometry. The overlapping layers of material may include electrically conductive layers 28 that are spaced apart from each other in a normal direction by way of one or more insulating intermediate layers 30. In the disclosed embodiment, the electrically conductive layers 28 of rotor comb 22 are substantially identical (e.g., within engineering tolerances) to each other (and, in some embodiments, also substantially identical to electrically conductive layers 28 of stator comb 20) and fabricated from any material suitable for conducting an electric current. For example, electrically conductive layers 28 of rotor comb 22 may be fabricated from a silicon material (e.g., from single-crystalline silicon or polycrystalline silicon), copper, gold, silver, etc. It is contemplated, however, that a shape, thickness, and/or material of electrically conductive layers 28 of rotor comb 22 could be different.

Insulating layer(s) 30 of rotor comb 22 may have a shape that is substantially identical (e.g., within engineering tolerances) to a shape of adjacent electrically conductive layers 28 of rotor comb 22 (and, in some embodiments, also substantially identical to insulating layer(s) 30 of stator comb 20), but with a reduced thickness in some applications. Insulating layer(s) 30 of rotor comb 22 may be made from any suitable material that is electrically insulating. For example, insulating layer(s) 30 of rotor comb 22 may be made from a silicon material (e.g., from silicon oxide). Alternatively, insulating layer(s) 30 of rotor comb 22 may simply constitute an orthogonal spacing between conductive layers 28 that is sufficient to inhibit arcing between adjacent conductive layers 28. The spacing may be filled with air or another inert gas (e.g., argon, helium, etc.).

In some embodiments, the finger and spine geometries of each layer 28, 30 of rotor comb 22 are fabricated separately, stacked on top of each other, and thereafter bonded together to form fingers 24 and spine 26. In other embodiments, however, the finger and spine geometries are formed within all layers 28, 30 of rotor comb 22 at the same time. For example, the finger and spine geometries of all layers 28, 30 may be made from a pre-fabricated double-silicone-on-insulator (DSOI) wafer.

Rotor comb 22 may be moveable within system 10. For example, fingers 24 of rotor comb 22 may be configured to pivot about the associated spine 26, relative to stator comb 20. This pivotal relationship between rotor comb 22 and stator comb 20 may be achieved in many different ways. For example, a torque hinge, a flexure, a pivot shaft, a spring, and/or another similar connecting device 32 (as shown in FIGS. 2A-2B) may be located between spine 26 of rotor comb 22 and a stationary portion (e.g., the substrate discussed above) of system 10.

It is contemplated that connecting device 32 may pass through spine 26 within the same general plane containing insulating layer 30 (e.g., within a central plane of rotor comb 22) or within another plane (e.g., a plane containing one of the electrically conductive layers 28). When connecting device 32 passes through the plane of insulating layer 30 (shown in FIG. 2B), insulating layer 30 of rotor comb 22 may generally align (e.g., be coplanar) with insulating layer 30 of stator comb 20 at the neutral position, and angle α may be about equal to angle β. However, when connecting device 32 passes through another plane of rotor comb 22, the insulating layers 30 of rotor and stator combs 20, 22 may not align at the neutral position, and angle α may be different from angle β.

It is contemplated that connecting device 32 may be configured to generate a desired level of centering-torque that returns rotor comb 22 to the neutral position (as shown in FIG. 1B) described above. It is also contemplated, however, that connecting device 32 may generate little or no centering torque, in some applications. A reduction in the centering torque may result in greater efficiencies of system 10 and/or a greater range of motion between the first and second end positions for a given voltage differential applied to stator and rotor combs 20, 22.

As shown in FIG. 1B, rotor comb controller 16 is connected between power sources Vr+. Vr− and rotor comb 22, and stator comb controller 18 is connected between power sources Vs+, Vs− and stator comb 20. In some embodiments, rotor comb controller 16 and stator comb controller 18 may be integrated as a single controller. For example, a single controller may be used to control both rotor comb 22 and stator comb 20. In some embodiments, one of the controllers 16 and 18 may be omitted such that power may be supplied directly to rotor comb or stator comb without going through the controller. For example, rotor comb controller 16 may be omitted such that power source Vr+, Vr− may be connected directly to rotor comb 22. As will be explained in more detail below, controller(s) 16 and/or 18 may selectively apply voltage from one or more power sources to comb drive 14, thereby generating a bi-directional rotational actuation torque T applied to optic 12.

Vr+/Vr−/Vs+/Vs− may be supplied by any type of power source(s) known in the art for use with a comb drive. In one embodiment, a voltage source configured to generate bipolar voltage outputs having an absolute voltage value ranging from, for example, 0 volts to about 10 volts or more may be used. It is contemplated, however, that other types and/or capacities of power sources may be utilized. In some embodiments, Vr+ and Vr− may have opposite polarities, such as Vr+ being a positive voltage while Vr− being a negative voltage. Vs− may be an intermediate voltage (e.g., connected to the ground) that is higher than Vr− but lower than Vr+. Vs+ may provide a voltage differential from Vs−. For example, Vs+ may be configured to be a higher voltage than Vs−. In some embodiments, the voltage difference between Vs+ and Vs− may the same as or different from the voltage difference between Vr+ and Vr−.

As discussed above, controllers 16 and 18 may be separate controllers, combined as a single controller, or, in some embodiments, one of the controllers 16, 18 may be omitted. In the following, controllers 16 and 18 will be discussed together and referred to as controller 16/18 to accommodate any of the above configurations. Controller 16/18 may include any appropriate type of general-purpose or special-purpose microprocessor, digital signal processor, graphic processor, or microcontroller. In some embodiments, controller 16/18 can constitute a single core or multiple cores executing parallel processes simultaneously. For example, controller 16/18 can be a single-core processor configured with virtual processing technologies. In certain embodiments, controller 16/18 uses logical processors to simultaneously execute and control multiple processes. Controller 16/18 can implement virtual machine technologies or other known technologies to provide the ability to execute, control, run, manipulate, and store multiple software processes, applications, programs, etc. In another embodiment, controller 16/18 includes a multiple-core processor arrangement (e.g., dual core, quad core, etc.) configured to provide parallel processing functionalities that allow execution of multiple processes simultaneously. As discussed in further detail below, controller 16/18 may be specially configured with one or more applications and/or algorithms for performing method steps and functions of the disclosed embodiments. For example, controller 16/18 can be configured with hardware and/or software components that enable controller 16/18 to receive input indicative of a desire to tilt or otherwise move optic 12, and to selectively apply a desired voltage to one or more of conductive layers 28 of stator and/or rotor combs 20, 22. It is appreciated that other types of processor arrangements could be implemented that provide for the capabilities disclosed herein.

As shown in FIG. 1B, controllers 16 and 18 may be provided with memories 34 and 36, respectively, which store one or more executable programs for generating and/or regulating the actuating torque T. Memory 34/36 may include a volatile or non-volatile, magnetic, semiconductor, tape, optical, removable, non-removable, or other type of storage device or tangible and/or non-transitory computer-readable medium.

Figure 3:
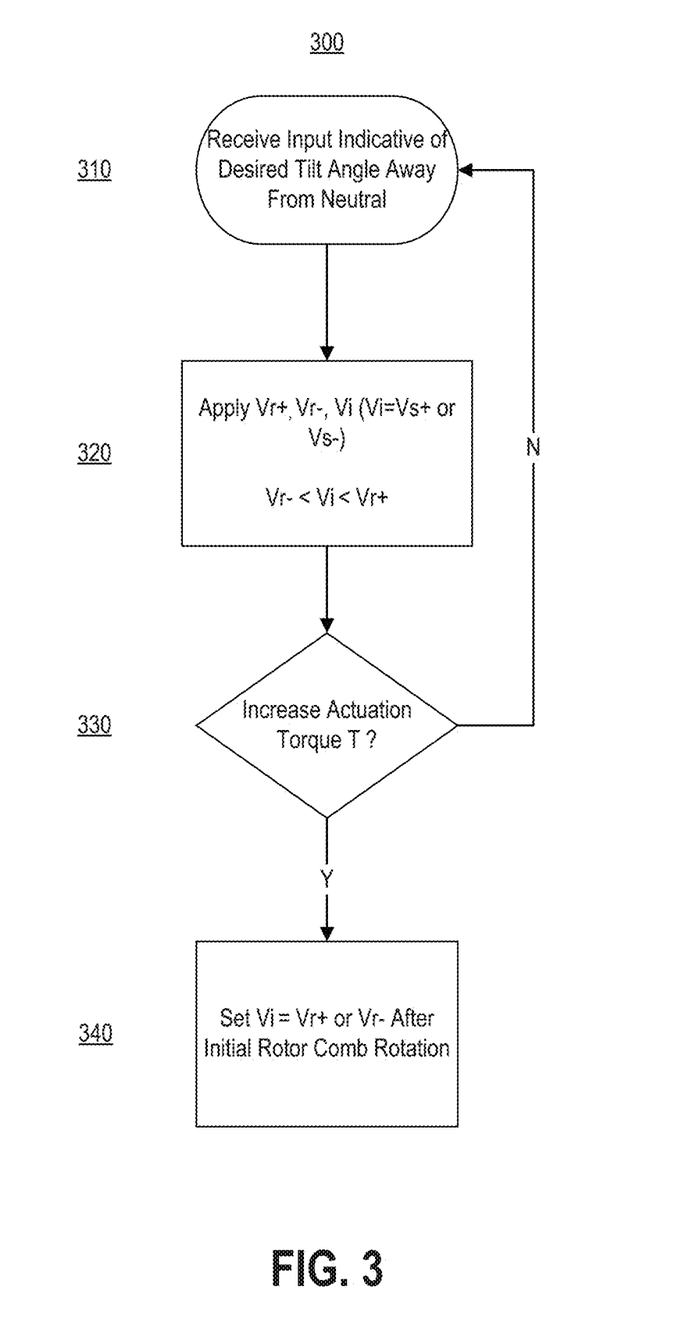
FIG. 3 is a flowchart illustrating an example method of operating the comb drive and system of FIGS. 1A-1D and 2A-2B.

The programs contained within memory 34/36, when executed by controller 16/18, may result in actuation torques T being generated that have different magnitudes and/or directions. For example, depending on which of layers 28 are applied with voltages having appropriate polarities, a magnitude of the associated voltages, and timings of the connections, rotor comb 22 may be caused to rotate from the neutral position in a counterclockwise direction (e.g., as seen from the perspective of FIGS. 1C and 2A) or in a clockwise direction (e.g., as seen from the perspective of FIGS. 1D and 2B) to any position between the first and second end positions. FIG. 3 illustrates a flowchart of an example method 300 that can be performed by controller 16/18 during operation of system 10 to generate a desired magnitude and direction of the actuation torque T.

Method 300 may be implemented at any time during operation of system 10. Method 300 may begin with controller 16/18 receiving input indicative of a desired tilt angle and/or change in tilt angle of optic 12 (Step 310). The input may be received manually (e.g., from a user of system 10) and/or automatically (e.g., as feedback from an associated sensor—not shown, as part of a larger application program, or in another manner known in the art). In response to the input, controller 16/18 may selectively apply one or more voltage outputs from one or more power sources (e.g., Vr+, Vr1, Vs+, Vs−) to one or more electrically conductive layers 28 of stator and/or rotor combs 20, 22 in Step 320.

For example, controller 16/18 may a first voltage level (Vr+) to a first (e.g., upper, relative to the perspective of FIGS. 1B-1D and 2A-2B) electrically conductive layer 28 of rotor comb 22, and apply a second voltage level (Vr+) to a second (e.g., lower, relative to the perspective of FIGS. 1B-1D and 2A-2B) electrically conductive layer 28 of rotor comb 22. In some embodiments, Vr+ and Vr− may have opposite polarities. For example, Vr+ may be a positive voltage level and Vr− may be a negative voltage level. In some embodiments, the absolute values (magnitudes) of Vr+ and Vr− are substantially the same. In other embodiments, the absolute values of Vr+ and Vr− may be different. The bipolar charged rotor comb (e.g., upper and lower electrically conductive layer 28 are insulated from each other by insulating layer 30 and charged with opposite electrical charges) may be utilized to achieve bi-directional rotation in cooperation with an appropriately charged stator comb.

Controller 16/18 may additionally apply an intermediate voltage level Vi (e.g., Vi=Vs− or Vs+) to one of the electrically conductive layers 28 of stator comb 20. The intermediate voltage level Vi may be within a range defined by the first and second voltage level. For example, when Vs− is used as the intermediate voltage level, Vs− may satisfy Vr−<Vs−<Vr+. Controller 16/18 may apply either the first or second voltage level (Vr+ or Vr−) to the remaining electrically conductive layer 28 of stator comb 22. For example, Vs+=Vr+ to rotate counterclockwise (shown in FIGS. 1C and 2A), or Vs+=Vr− to rotate clockwise (shown in FIGS. 1D and 2B).

The actuation torque T generated at Step 320 may have opposite directions, depending on which of the electrically conductive layers 28 of stator comb 20 receives the intermediate voltage level (Vi) and which receives the first or second voltage level (Vr+ or Vr−). For example, referring to FIGS. 1C and 2A, an exemplary operation process will be described for rotating rotor comb 22 counterclockwise. Controller 16 may apply Vr+ to the upper electrically conductive layer 28 of rotor comb 22 and apply Vr− to the lower electrically conductive layer 28 of rotor comb 22. Vr+ may be a positive voltage and Vr− may be negative voltage. Vr+ and Vr− define a voltage range [Vr−, Vr+]. An intermediate voltage level Vi (Vr−<Vi<Vr+) may be used to create a voltage differential to rotate rotor comb 22. For example, controller 18 may apply Vs+=Vr+, the same positive voltage to the upper electrically conductive layer 28 of stator comb 20 and ground the lower electrically conductive layer 28 of stator comb 20 (e.g., Vs−=GND). Here, the ground voltage level constitutes the intermediate voltage level Vi, which is within the range [Vr−, Vr+]. A greater voltage differential is created between the upper conductive layer 28 of stator comb 20 and the lower conductive layer 28 of rotor comb 22 (e.g., Vr+−Vr−), as compared to a voltage differential between both the lower conductive layers of rotor comb 22 and stator comb 20 (e.g., GND−Vr−). This greater voltage potential may result in an actuation torque T that functions to rotate rotor comb 22 in the counterclockwise direction (relative to the perspective of FIGS. 1C and 2A).

In contrast, as shown in FIGS. 1D and 2B, when controller 18 applies Vr− to the lower conductive layer 28 of stator comb 20 (e.g., Vs−=Vr−) and ground the upper conductive layer 28 of stator comb 20 (e.g., Vs+=GND), a greater voltage differential is created between the upper conductive layer 28 of rotor comb 22 and the lower conductive layer 28 of stator comb 20 (e.g., Vr+−Vr−), as compared to a voltage differential between both the upper conductive layers of stator comb 20 and rotor comb 22 (e.g., Vr+−GND). This greater voltage potential may result in an actuation torque T that functions to rotate rotor comb 22 in the clockwise direction (relative to the perspective of FIGS. 1D and 2B).

As seen from the above examples, to change the rotational direction, controller 18 may change the voltage level applied to one of the conductive layers 28 (e.g., lower layer) of stator 20 from the intermediate voltage level (e.g., GND) to one of the first or second voltage level (e.g., Vr+ or Vr−), and change the voltage level applied to another one of the conductive layers 28 (e.g., upper layer) of stator 20 from the first or second voltage level (e.g., Vr+ or Vr−) to the intermediate voltage level (e.g., GND).

Figure 4:
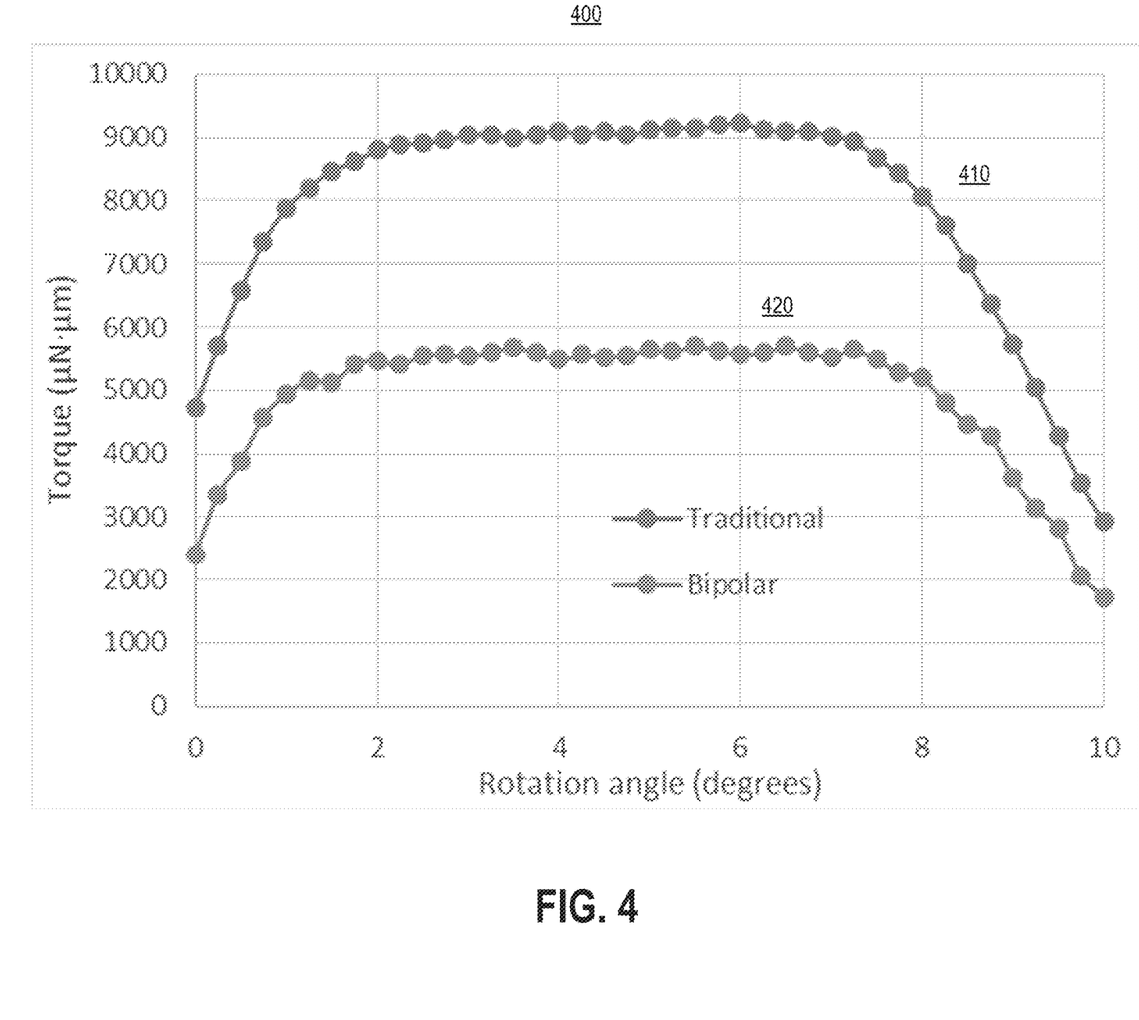
FIG. 4 is a performance chart illustrating performance improvements associated with the disclosed comb drive and system.

The actuation torques T resulting in the above examples may be related (e.g., proportional) to a difference between the voltage differential of Vr+−Vr− and Vr+/Vr−−Vi. In particular, while the greater differential (Vr+−Vr−) will cause rotation of rotor comb 22, the lesser differential (Vr+/Vr−−Vi) will oppose the pivoting and reduce the associated actuation torque T. As shown in a performance chart 400 of FIG. 4, this reduced actuation torque T has been found to be about 70% of the force generated by a traditional SVC. Specifically, performance chart 400 illustrates a first curve 410 associated with a torque generated by a traditional SVC at a given angle α, as well as a second curve 420 associated with a force generate by the disclosed comb drive at the same actuation angle α. This lower actuation torque may be acceptable in some applications, where only the greater range of motion associated with the disclosed comb drive is important. As will be described in more detail below, controller 16/18 may be specially configured to selectively adjust voltage levels applied to comb drive 14 in other applications in order to achieve the same or greater levels of actuation torque T as those generated by a traditional SVC.

For example, in Step 330, when controller 16/18 determines that an actuation torque T is desired that is greater than what can be affected via completion of Step 320, control may proceed to a Step 340. The determination of Step 330 may be made based on known application specifications, based on the input received at Step 310, based on a comparison of comb drive performance (e.g., actual tilt angle achieved vs desired tilt angle, as measured by one or more sensors—not shown), or based on any other criteria known in the art.

Step 340 may be implemented after completion of Step 320 and after rotor comb 22 has started pivoting or rotating in the associated direction (e.g., after rotor comb 22 and stator comb 20 disengage from the neutral position). For example, Step 340 may be completed after a period of time has elapsed (e.g., a period sufficient for the pivoting motion to be realized) following completion of Step 320 and/or after the pivoting of rotor comb 22 has been detected (e.g., via a sensor—not shown). Step 320 should be completed and motion initiation of rotor comb 22 should begin prior to completion of Step 340. Otherwise, rotor comb 22 may be not actually be caused to pivot at all, and instead by electrostatically held in its original position.

During completion of Step 340, controller 18 may change the intermediate voltage level (Vi) to one of the Vr+ or Vr−. For example, during a counterclockwise rotation, the intermediate voltage level may be changed to Vr−. On the other hand, during a clockwise rotation, the intermediate voltage level may be changed to Vr+. This operation may reduce a magnitude of the lower voltage differential described above, thereby also reducing a magnitude of the opposition to the desired pivoting motion. In this way, the actuation torque T may be increased to at least the level of a traditional SVC.

The disclosed system may provide for a large range of pivoting/rotating motion (e.g., as much as twice the range or more of a traditional SVC), with a simple, low-cost, and efficient comb drive. The disclosed comb drive may have a large range of pivoting motion due its bipolar motive capability (e.g., the ability to rotate clockwise and counterclockwise away from a neutral position). The disclosed comb drive may be simple due to a reduction in parts normally required to achieve the same range of motion utilizing multiple sets of traditional SVCs. In addition, the reduced part count may facilitate a reduction in cost. Greater efficiency may be realized through a reduction in torque normally required of a traditional SVC to return the associated rotor comb to the neutral position.

It will be apparent to those skilled in the art that various modifications and variations can be made to the disclosed comb drive, system, and related method. Other embodiments will be apparent to those skilled in the art from consideration of the specification and practice of the disclosed comb drive, system, and related method.

It is intended that the specification and examples be considered as exemplary only, with a true scope being indicated by the following claims and their equivalents.

What is claimed is:

1. A comb drive system, comprising:
 a comb drive comprising:
  a stator comb having a first electrically conductive layer spaced apart from a second electrically conductive layer; and
  a rotor comb having a first electrically conductive layer spaced apart from a second electrically conductive layer;
 at least one power source; and
 a controller connected between the at least one power source and the comb drive, the controller being configured to:
  apply a first voltage level from the at least one power source to the first electrically conductive layer of the rotor comb;
  apply a second voltage level from the at least one power source to the second electrically conductive layer of the rotor comb, the first and second voltage levels having opposite polarities;
  apply an intermediate voltage level to one of the first and second electrically conductive layers of the stator comb, wherein the intermediate voltage level is lower than the first voltage level and higher than the second voltage level; and
  change the intermediate voltage level to one of the first or second voltage level after a rotation of the rotor comb is initiated such that voltage levels applied to the first and second conductive layers of the stator comb have opposite polarities.

2. The comb drive system of claim 1, wherein the controller is configured to apply one of the first or second voltage level to another one of the first and second electrically conductive layers of the stator comb.

3. The comb drive system of claim 2, wherein the controller is configured to change a rotational direction of the rotor comb by:
 changing the voltage level applied to the one of the first or second electrically conductive layer of the stator comb from the first or second voltage level to the intermediate level; and
 changing the voltage level applied to another one of the first or second electrically conductive layer of the stator comb from the intermediate level to the first or second voltage level.

4. The comb drive system of claim 1, wherein the controller is configured to bi-directionally rotate the rotor comb from a neutral position.

5. The comb drive system of claim 1, wherein the first voltage level is a positive voltage level and the second voltage level is a negative voltage level.

6. The comb drive system of claim 1, wherein the controller is configured to apply the intermediate voltage level by connecting the one of the first and second electrically conductive layers of the stator comb to ground.

7. The comb drive system of claim 1, wherein each of the rotor and stator combs includes an insulating layer disposed between the first and second electrically conductive layers.

8. A method of operating a comb drive having a stator comb and a rotor comb, comprising:
 applying a first voltage level from at least one power source to a first electrically conductive layer of the rotor comb;
 applying a second voltage level from the at least one power source to a second electrically conductive layer of the rotor comb, the first and second voltage levels having opposite polarities;
 applying an intermediate voltage level to one of the first and second electrically conductive layers of the stator comb, wherein the intermediate voltage level is lower than the first voltage level and higher than the second voltage level; and changing the intermediate voltage level to one of the first or second voltage level after a rotation of the rotor comb is initiated such that voltage levels applied to the first and second conductive layers of the stator comb have opposite polarities.

9. The method of claim 8, comprising applying one of the first or second voltage level to another one of the first or second electrically conductive layer of the stator comb.

10. The method of claim 9, comprising changing a rotational direction of the rotor comb by:

changing the voltage level applied to the one of the first or second electrically conductive layer of the stator comb from the first or second voltage level to the intermediate level; and changing the voltage level applied to another one of the first or second electrically conductive layer of the stator comb from the intermediate level to the first or second voltage level.

11. The method of claim 8, comprising bi-directionally rotating the rotor comb from a neutral position.

12. The method of claim 8, wherein the first voltage level is a positive voltage level and the second voltage level is a negative voltage level.

13. The method of claim 8, comprising applying the intermediate voltage level by connecting the one of the first and second electrically conductive layers of the stator comb to ground.

14. The method of claim 8, comprising connecting the first and second electrically conductive layers of the stator comb to ground to allow the rotor comb to return to a neutral position.

* * * * *